United States Patent [19]
Lehongres

[11] Patent Number: 6,157,073
[45] Date of Patent: Dec. 5, 2000

[54] ISOLATION BETWEEN POWER SUPPLIES OF AN ANALOG-DIGITAL CIRCUIT

[75] Inventor: Denis Lehongres, le Cheylas, France

[73] Assignee: STMicroelectronics S.A., Gentilly, France

[21] Appl. No.: 09/162,008

[22] Filed: Sep. 28, 1998

[30] Foreign Application Priority Data

Sep. 29, 1997 [FR] France .................................. 97 12298

[51] Int. Cl.[7] .................................................. H01L 29/00
[52] U.S. Cl. ........................ 257/500; 257/538; 257/547
[58] Field of Search ................................... 257/500, 501, 257/502, 537, 538, 547

[56] References Cited

U.S. PATENT DOCUMENTS

| | | | |
|---|---|---|---|
| 5,336,915 | 8/1994 | Fujita et al. | 257/369 |
| 5,459,349 | 10/1995 | Kobatake | 257/659 |
| 5,491,358 | 2/1996 | Miyata | 257/546 |
| 5,828,108 | 10/1998 | Toyoda | 257/372 |
| 5,880,515 | 3/1999 | Bartlett | 257/547 |
| 6,057,588 | 5/2000 | Yamazaki | 257/506 |

FOREIGN PATENT DOCUMENTS 0 464 751  1/1992  European Pat. Off. ........ H01L 27/02

OTHER PUBLICATIONS

Patent Abstracts of Japan, vol. 97, No. 7, Jul. 31, 1997 & JP-A-09 064276 (Fujitsu Ltd.).

Ananymous: "Nwell Structure For Substrate Noise Isolation" IBM Technical Disclosure Bulletin, vol. 31, No. 7, Dec. 1988, New York, US, pp. 351–352.

*Primary Examiner*—Ngân V. Ngô
*Attorney, Agent, or Firm*—Wolf, Greenfield & Sacks, P.C.; James H. Morris; Theodore E. Galanthay

[57] ABSTRACT

The present invention relates to a composite integrated circuit including at least one well that separates analog and digital blocks of the circuit, this well being connected to a first terminal of a power supply of biasing of one of the two blocks, and being of type opposite to that of the circuit substrate, and a resistor being interposed on the well biasing link.

20 Claims, 6 Drawing Sheets

ISOLATION BETWEEN POWER SUPPLIES OF AN ANALOG-DIGITAL CIRCUIT

BACKGROUND OF THE INVENTION

1. Field of the Invention

The present invention relates to the field of composite circuits integrating both a digital part and an analog part. The present invention more specifically aims at improving the isolation between the respective power supplies of the analog and digital parts of the integrated circuit.

2. Discussion of the Related Art

FIG. 1 very schematically shows an example of a composite circuit in CMOS technology. In an integrated circuit 1, the MOS transistors are distributed in blocks 2, 3, respectively corresponding to the digital and analog parts of the circuit. Analog block 2 and digital block 3 are separated from each other by an area 4. The integrated circuit, generally mounted on a printed circuit (not shown), is connected to supply terminals, for example, a positive terminal Vdd and a ground terminal GND. Analog block 2 and digital block 3 are supplied separately, that is, by means of different leads of the integrated circuit.

In FIG. 1, the different parasitic inductances and resistors of the package, associated with the power supply of the different components of the analog and digital blocks, have been modelled. Power to an analog component is provided, from supply line Vdd of the printed circuit via a parasitic inductance Lap in series with a parasitic resistor Rap, and this component is connected to ground GND of the printed circuit, also via a parasitic resistor Ran and a parasitic inductance Lan. Similarly, power to a digital component is provided, from line Vdd via a parasitic inductance Lnp in series with a parasitic resistor Rnp, and this component is connected to ground GND via a parasitic resistor Rnn in series with a parasitic inductance Lnn.

These parasitic inductances and resistors essentially correspond to the wire link between a pad of the integrated circuit chip and the corresponding lead, to this lead, and to the connection between the lead and the support of the integrated circuit package, currently, a printed circuit.

For each switching of a MOS transistor of the digital block, a parasitic pulse of the supply current occurs, and a noise voltage varying as L.di/dt+Ri, where L and R correspond to the parasitic inductance and resistance of the connection involved, is reflected on the power supply. It is generally desired, in a composite circuit, to avoid having this noise corrupt the analog part of the circuit and alter its operation.

Further, in a composite circuit, the isolation between the digital and analog grounds is delicate, especially when the substrate is relatively strongly conductive (a few ohms per centimeter).

A first conventional solution to improve the isolation between the digital and analog power supplies is to separate blocks 2 and 3 from the integrated circuit as much as possible. The resistance of separation area 4 is thus increased. Such a solution has the obvious disadvantage of increasing the circuit bulk.

FIG. 2 schematically illustrates a second conventional solution to improve the isolation between the digital and analog supplies of a composite circuit. FIG. 2 schematically shows a cross-sectional view of an integrated circuit in its central region 4 of separation between analog block 2 and digital block 3. As an example, the case of a circuit in which a P-type epitaxial layer 10 is formed on a P-type silicon wafer 11 has been considered. Epitaxial layer 10 forms the "substrate" in which MOS transistors or wells containing MOS transistors are formed. Still as an example and for clarity, a single MOS transistor, respectively 12, 13, of each block 2, 3, has been shown. These are P-channel transistors made in N-type wells 14, 14'. On the analog side, a contact 15, formed in a heavily-doped (N⁺) area 21, itself formed in well 14, is connected to potential Vdd (via parasitic inductance Lap and parasitic resistor Rap). On the digital side, a contact 15' formed on a heavily-doped (N⁺) area 21', itself formed in well 14', is connected to potential Vdd (via parasitic inductance Lnp and parasitic resistor Rnp).

FIG. 2 also shows contacts 24, 24' used to bias substrate 10, respectively, in blocks 2 and 3. These contacts are formed on heavily-doped (P⁺) areas, respectively 25 and 25'. Contact 24 is connected to the analog ground (not shown) of block 2, and thus to ground GND of the integrated circuit via parasitic inductance Lan and parasitic resistor Ran (FIG. 1). Similarly, contact 24' is connected to the digital ground (not shown) of block 3, and thus to ground GND of the integrated circuit via parasitic inductance Lnn and parasitic resistor Rnn (FIG. 1). The presence of contacts 24 and 24' enables substrate 10 to be equipotential and avoids the occurrence of latchup problems. Any potential variation on contact 24' or on contact 15', originating from a switching of digital block 3, generates noise on contact 24 via substrate 10 which forms a direct parasitic coupling path between the respective grounds of the digital and analog parts.

To improve the isolation between the analog and digital supplies for a given spacing between blocks 2 and 3, a well 16 of type opposite to that of epitaxial layer 10 is provided along the entire substrate length in area 4. In the example shown, well 16 is of type N.

The presence of well 16 reduces the thickness of epitaxial layer 10 in area 4 and, thereby, the parasitic conduction area between analog block 2 and digital block 3 (between transistors 12 and 13).

Most often, well 16 is biased by the positive supply of analog block 2 or of digital block 3 by means of a track 22 contacting a heavily-doped (N⁺) area 23, to reverse bias the well/substrate junction.

In FIG. 2, a full line 17 symbolizes a biasing of well 16 by the positive supply of digital block 3, and a dotted line 18 symbolizes the biasing of well 16 by the positive supply of analog block 2.

A disadvantage of such a solution is that the lateral stray capacitors C1, C2, and the vertical stray capacitor C3 of the PN junctions created by well 16 destroy the expected effect. Indeed, since supply voltage Vdd is corrupted by the switching noise of the digital part (the switching noise on the positive supply line and the ground lines are equivalent in spectrum and amplitude), this noise is carried by the junction stray capacitors of well 16.

If well 16 is biased by the power supply of the digital block (connection 17), noise coming from the power supply of block 3 is transmitted to the ground of the analog block through capacitors C1 (perimeter capacitor) and C3 (well bottom surface capacitor).

If well 16 is biased by the power supply of the analog block (connection 18), switching noise coming from the ground of digital block 3 corrupts the positive power supply of the analog block via capacitors C2 and C3.

SUMMARY OF THE INVENTION

The present invention aims at overcoming the disadvantages of known solutions of isolation of elements between the analog and digital parts of a composite circuit.

To achieve this and other objects, the present invention provides a composite integrated circuit including at least one well that separates analog and digital blocks of the circuit, this well being connected to a first terminal of a power supply adapted to bias one of the two blocks, and being of type opposite to that of the circuit substrate, and a resistor being interposed on the well biasing link.

According to an embodiment of the present invention, the resistor is a polysilicon resistor.

According to an embodiment of the present invention, the resistor is a resistor diffused in the well.

According to an embodiment of the present invention, the circuit includes two parallel wells, of a type opposite to that of the substrate and extending along the entire length of the substrate, each well being respectively connected, via a resistor, to a first terminal of the biasing power supply of one of the digital and analog blocks.

According to an embodiment of the present invention, the circuit includes a contact formed along the entire substrate length, interposed between both wells, and connected to a second terminal of the biasing power supply.

According to an embodiment of the present invention, the well(s) are of type N, the potential of the first power supply potential being the most positive potential of the power supply voltage.

According to an embodiment of the present invention, the well(s) are of type P, the potential of the first power supply potential being the most negative potential of the power supply voltage.

The foregoing objects, features and advantages of the present invention will be discussed in detail in the following non-limiting description of specific embodiments made in connection with the accompanying drawings.

DETAILED DESCRIPTION

For clarity, the same elements have been referred to with the same references in the different drawings and these drawings are not to scale.

Figure 1:
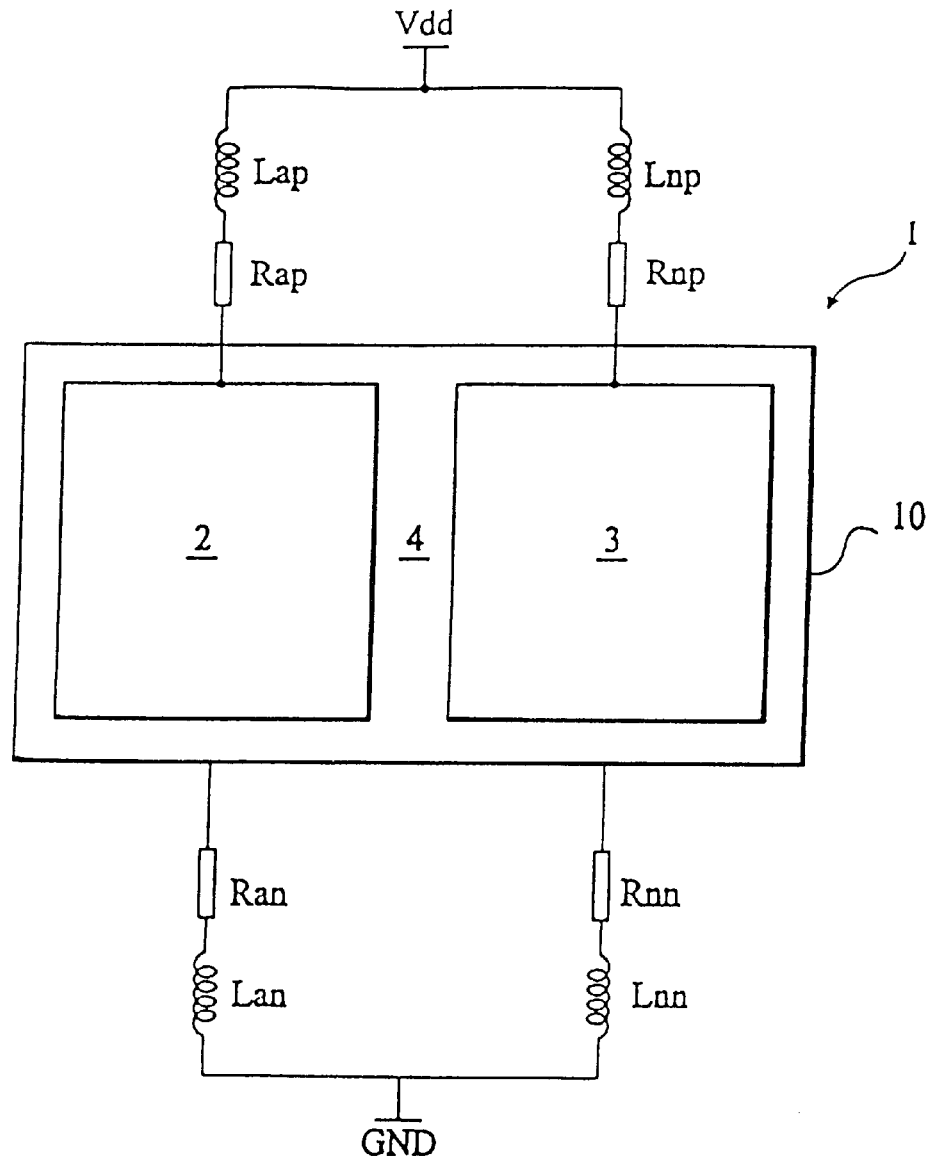
FIGS. 1 and 2, previously described, are meant to show the state of the art and the problem to solve.
Figure 2:
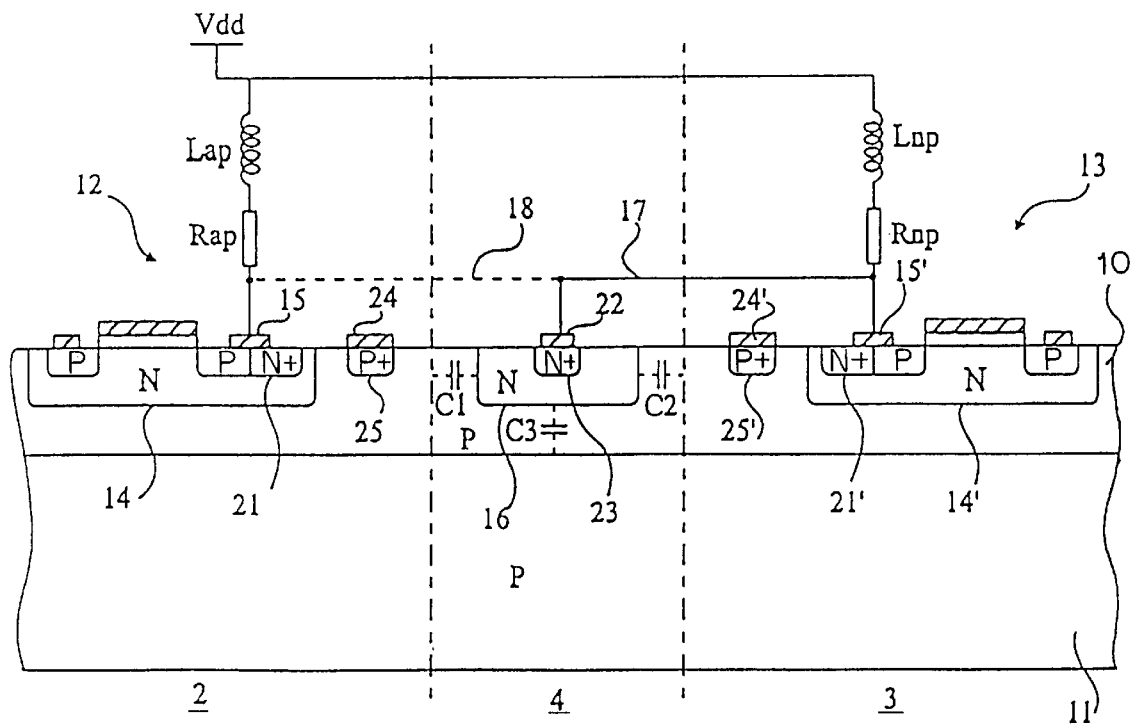
Figure 3:
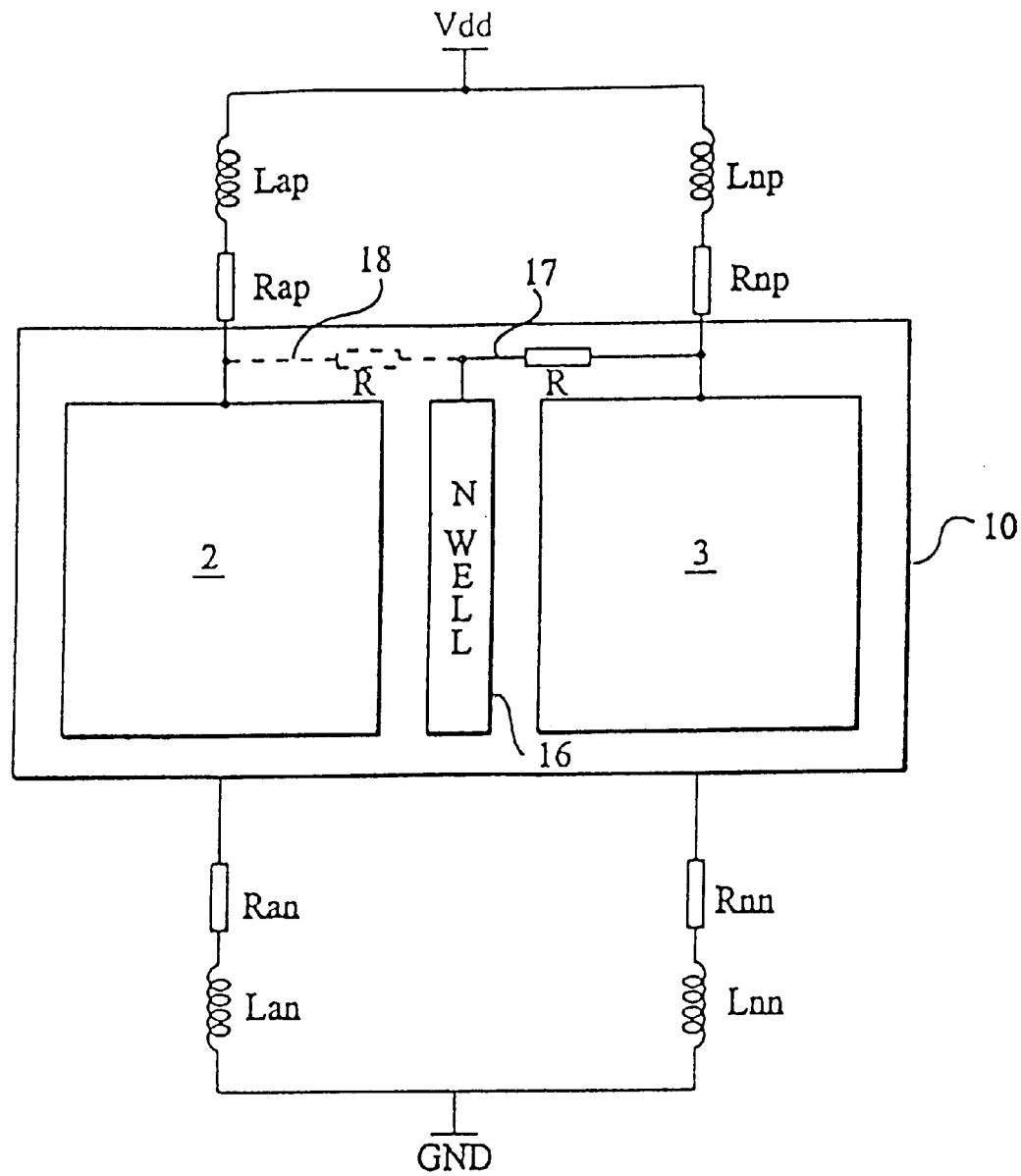
FIGS. 3 and 4 are simplified views, respectively, a top view and a cross-sectional view, of a first embodiment of a composite integrated circuit according to the present invention.
Figure 4:
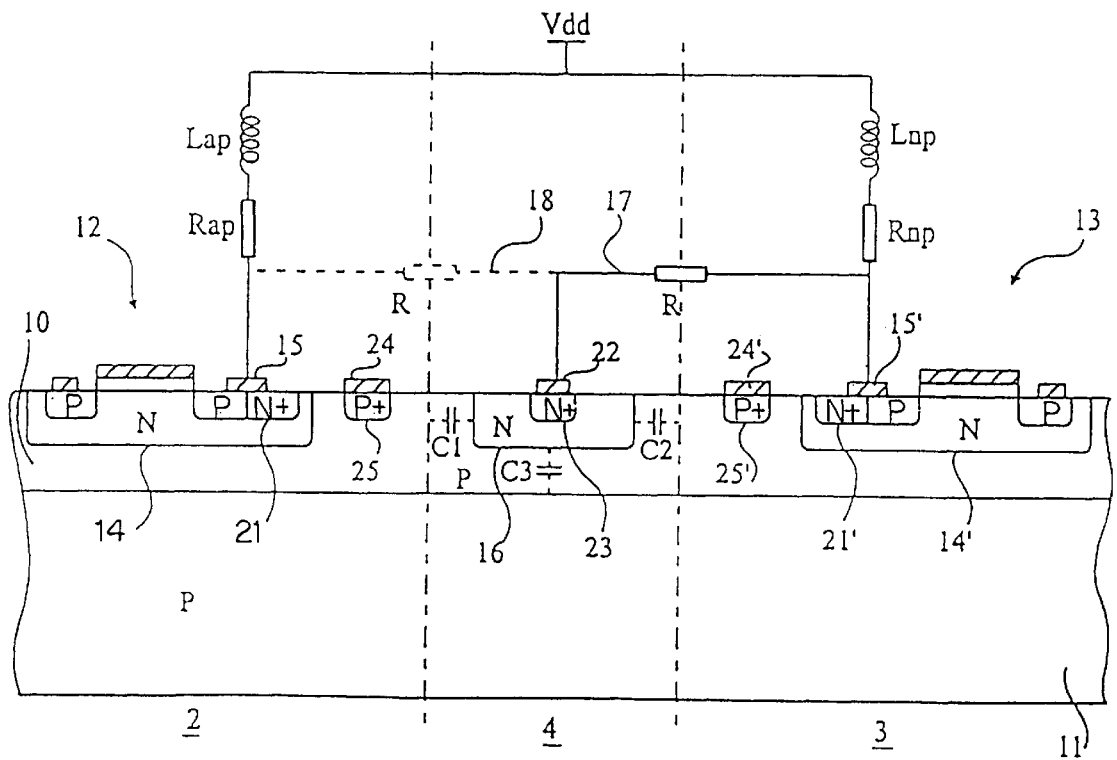

FIGS. 3 and 4 very schematically illustrate a first embodiment of a composite integrated circuit according to the present invention.

As previously, this circuit includes two blocks, respectively, an analog block 2 and a digital block 3, separated by a well 16 of type opposite to that of epitaxial layer 10 (FIG. 4) in which respective transistors 12, 13 of analog block 2 and digital block 3 are implemented. Well 16 is biased by one of the supplies of blocks 2 and 3.

A characteristic of the present invention is to interpose, on the line of positive biasing of well 16 (full line 17 for a biasing on the digital side, or dotted line 18 for a biasing on the analog side), a resistor R. The function of this resistor is to form, with stray capacitances C1, C3, or C2, C3 of well 16, an RC cell for filtering the switching noise.

Due to the addition of resistor R, a cut-off frequency is introduced on the path of the current crossing the stray capacitors (C1, C3 if well 16 is biased by the digital supply—C2, C3 if well 16 is biased by the analog supply). This cut-off frequency is equal to $1/2\pi RC$, where C represents the sum of the stray capacitances C1, C2, C3 involved.

The value for resistance R should not be too high so that well 16 is effectively biased. As a specific example of embodiment, the value of resistance R is included between 10 k$\Omega$ and 100 k$\Omega$.

The value of the stray capacitance involved in the RC filtering of first order thus implemented depends on the size of well 16. The larger well 16, the higher the stray capacitance.

The sizings of resistor R and of well 16 depend on the operating frequencies of the digital block, the latter conditioning the switching noise spectrum. Since the switching noise spectrum of the digital part is generally high (for example, between 200 and 400 MHz), the value of resistance R is compatible with an integration thereof. Thus, resistor R is, for example, a polysilicon integrated resistor. As an alternative, resistor R is a resistor diffused, for example, directly in the well. As a specific example of embodiment, the cut-off frequency introduced by the RC filter of the present invention is on the order of 1 MHz.

The choice between biasing well 16 on the analog side or on the digital side depends on the acceptable noise thresholds on the analog and digital block power supplies.

In the case (not shown) where the power supply of the digital block is divided between a power supply meant for the core of the digital circuit and a power supply meant for the input/output accesses, it will be preferred to bias well 16 by the core power supply which exhibits a higher noise spectrum.

Figure 5:
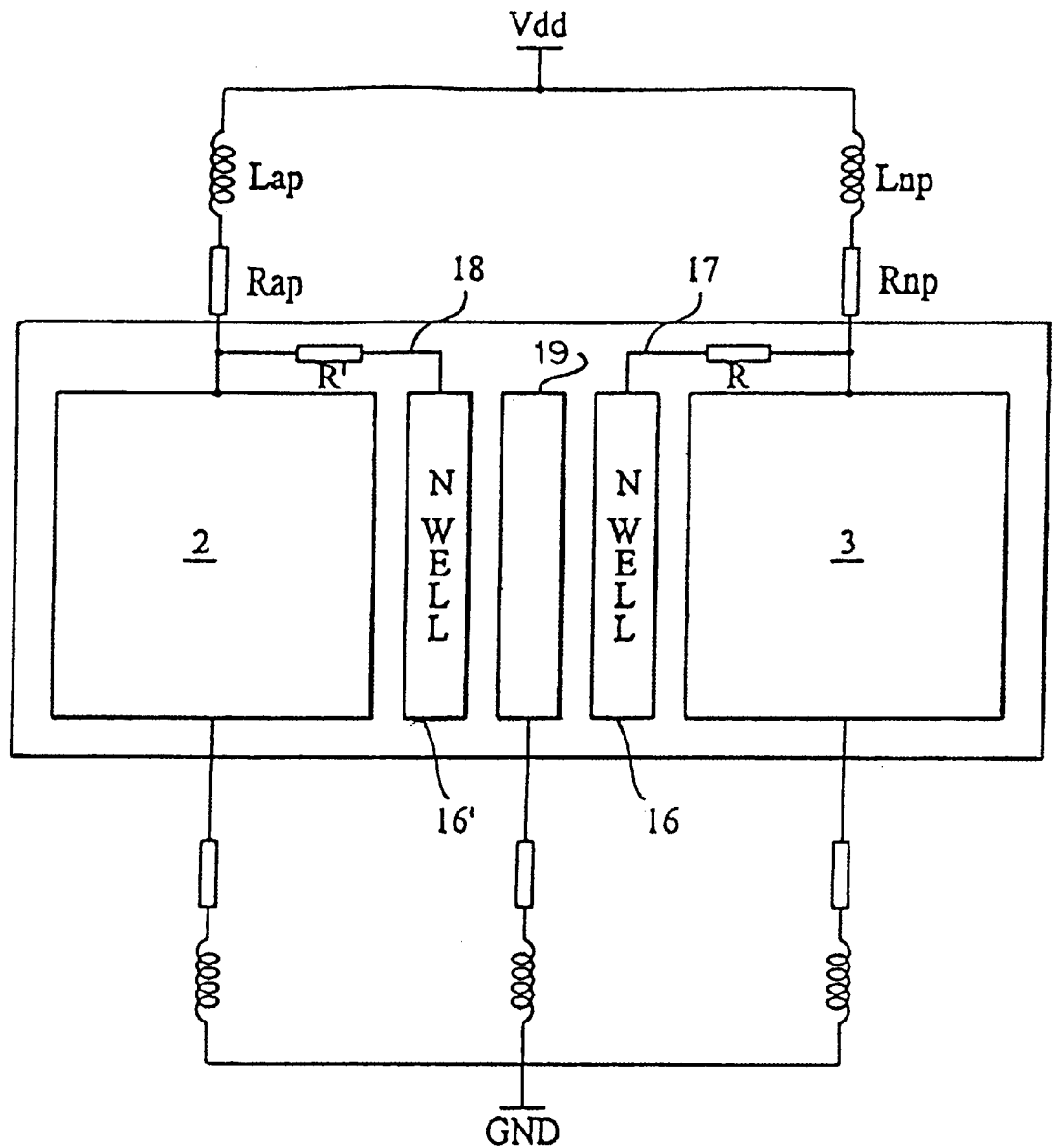
FIGS. 5 and 6 are simplified views, respectively, a top view and a cross-sectional view, of a second embodiment of a composite integrated circuit according to the present invention.
Figure 6:
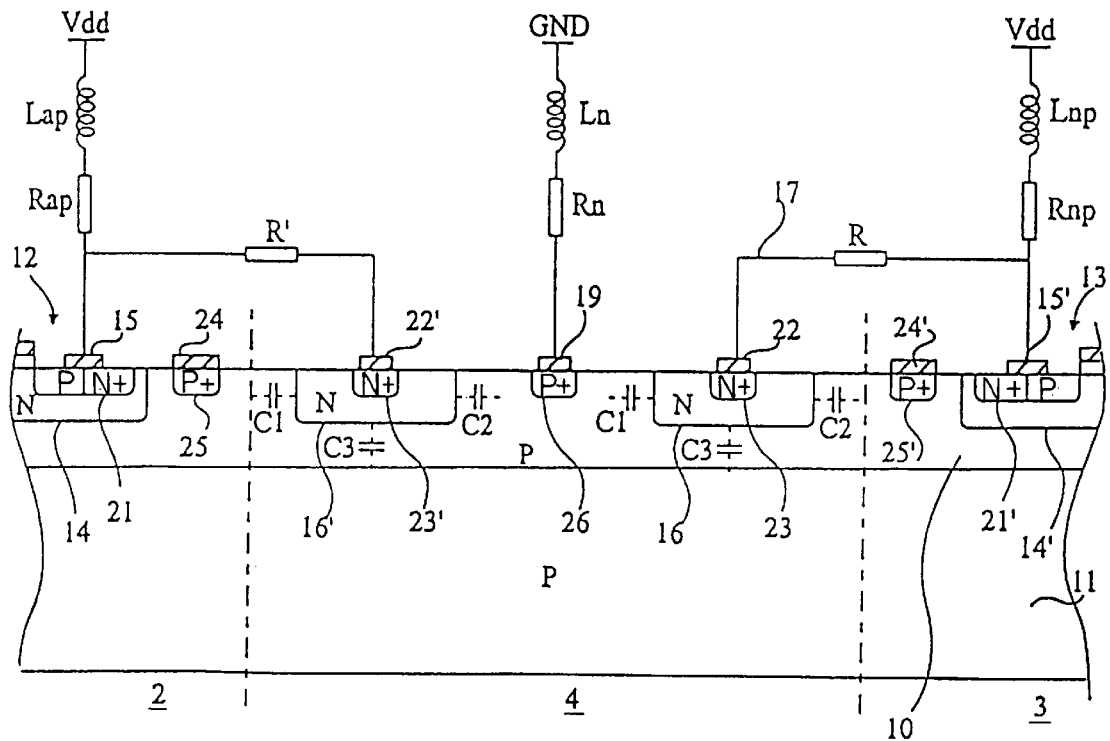

FIGS. 5 and 6 illustrate a second embodiment of a composite integrated circuit according to the present invention.

According to this embodiment, two wells 16, 16' of types opposite to that of epitaxial layer 10 of the integrated circuit are respectively associated with digital block 3 and analog block 2. Each well 16, 16' is biased via a resistor R, R' by the supply of block 3, 2, associated therewith.

An additional contact 19 extends along the entire length of substrate 10 between wells 16 and 16' and grounds said substrate via a heavily-doped area 26 (P$^+$). Contact 19 is connected to ground GND of the printed circuit, and is thus grounded, neglecting the switching noise.

This second embodiment of the present invention has the advantage of draining the current lines by a cold region (that is, connected to the ground), which further improves the isolation between the digital and analog supplies of the integrated circuit.

Of course, the present invention is likely to have various alterations, modifications, and improvements which will readily occur to those skilled in the art. In particular, the sizing of the resistors inserted on the well biasing lines, and the sizing of the wells contributing to the RC filtering depend, in particular, on the available space and on the switching noise spectrum of the digital part. Further, although the present invention has been described in relation with an integrated circuit implemented on a P-type wafer and in a P-type epitaxial layer, the present invention also applies to a composite integrated circuit implemented on an N-type wafer and in an N-type epitaxial layer. In this case, the wells biased via the resistors according to the present invention will be of type P and the connections to GND and to Vdd will be inverted.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A composite integrated circuit including two parallel wells that separate analog and digital blocks of the circuit, each well being of a conductivity type opposite to that of the substrate, and being respectively connected to a first terminal of a power supply source adapted to bias one of the two blocks, wherein a resistor is respectively interposed on the biasing link of each well from a first terminal of the biasing power supply of the digital or analog block to form with strong capacitances of the wells, a filtering switching noise.

2. The circuit of claim 1, wherein the resistor is a polysilicon resistor.

3. The circuit of claim 1, wherein the resistor is a resistor diffused in the well.

4. The circuit of claim 3, including a contact formed along an entire length of the substrate, interposed between both wells, and connected to a second terminal of the biasing power supply.

5. The circuit of claim 4, wherein the wells are of type N, the potential of the first power supply potential being the most positive potential of the power supply voltage.

6. The circuit of claim 4, wherein the wells are of type P, the potential of the first power supply potential being the most negative potential of the power supply voltage.

7. The circuit of claim 1, wherein said analog block includes an analog block well in said substrate containing at least one transistor and said digital block includes a digital block well in said substrate containing at least one transistor.

8. The circuit of claim 7, wherein said two parallel wells along with said analog block well and said digital block well are all disposed in the same surface of said substrate.

9. A composite integrated circuit comprising:

an analog block;

a digital block;

a silicon substrate forming part of each block;

an analog block well in said substrate containing at least one transistor;

a digital block well in said substrate containing at least one transistor;

two parallel-disposed wells in said substrate that separate analog and digital blocks and being of a conductivity type opposite to that of said substrate;

said two wells being respectively coupled to a first terminal of a power supply source adapted to bias one of the two blocks;

and a pair of resistors, each respectively interposed on the biasing link of each parallel-disposed well from the first terminal of the biasing power supply of the digital or analog block.

10. The circuit of claim 9, wherein the resistor is a polysilicon resistor.

11. The circuit of claim 9, wherein the resistor is a resistor defused in the well.

12. The circuit of claim 11, including a contact formed along a length of the substrate, interposed between both of said parallel disposed wells, and connected to a second terminal of the biasing power supply.

13. The circuit of claim 12, wherein the parallel-disposed wells are of type N, the potential of the first power supply being the most positive potential of the power supply voltage.

14. The circuit of claim 12, wherein the parallel-disposed wells are of type P, the potential of the first power supply being the most negative potential of the power supply voltage.

15. The circuit of claim 9, wherein said parallel-disposed wells, along with said analog block well and said digital block well are all disposed in the same surface of said silicon substrate.

16. The circuit of claim 9, wherein each resistor, forms with straight capacitances of the well of the two parallel-disposed wells, a filter for filtering switching noise.

17. A composite integrated circuit comprising:

an analog block;

a digital block;

a silicon substrate forming part of each block;

an analog block well in said substrate containing at least one transistor;

at least one well in said substrate that separates the analog and digital blocks and being of a conductivity type opposite to that of said substrate;

said separating well being coupled to a first terminal of a power supply source adapted to bias one of the two blocks;

and at least one resistor interposed on the biasing link of the separating well from the first terminal of the biasing power supply of the digital or analog block.

18. The circuit of claim 17, wherein the resistor is adapted to form, with straight capacitances of the wells, a filter for filtering switching noise.

19. The circuit of claim 17, including two parallel-disposed wells in said substrate that separate analog and digital blocks and a related pair of resistors.

20. The circuit of claim 19, wherein the two parallel disposed wells along with the analog and digital block wells are all disposed in the same surface of the substrate.

* * * * *